United States Patent
Ouyang (10) Patent No.: US 7,348,193 B2
(45) Date of Patent: Mar. 25, 2008

(54) HERMETIC SEALS FOR MICRO-ELECTROMECHANICAL SYSTEM DEVICES

(75) Inventor: Mike Xu Ouyang, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/416,864

(22) Filed: May 2, 2006

(65) Prior Publication Data

US 2007/0004080 A1    Jan. 4, 2007

Related U.S. Application Data

(60) Provisional application No. 60/696,314, filed on Jun. 30, 2005.

(51) Int. Cl.
*H01L 21/00* (2006.01)

(52) U.S. Cl. .............. 438/25; 438/26; 438/33; 438/51; 438/55; 438/58; 438/64; 438/68; 438/106; 438/125; 438/126; 438/127; 257/E33.056

(58) Field of Classification Search ............. 43/25, 43/26, 33, 51, 55, 58, 64, 68, 106, 125–127
See application file for complete search history.

(56) References Cited

U.S. PATENT DOCUMENTS

| | | | |
|---|---|---|---|
| 3,969,640 A * | 7/1976 | Staudte ............ 310/312 |
| 5,293,511 A | 3/1994 | Poradish et al. |
| 5,458,716 A | 10/1995 | Alfaro et al. |
| 6,028,351 A | 2/2000 | Klonis et al. |
| 6,071,616 A | 6/2000 | Sulzbach |
| 6,455,927 B1 | 9/2002 | Glenn et al. |
| 6,586,831 B2 | 7/2003 | Gooch et al. |
| 6,624,921 B1 | 9/2003 | Glenn et al. |
| 6,627,814 B1 | 9/2003 | Stark |
| 6,639,711 B2 | 10/2003 | Orcutt |
| 6,667,837 B1 | 12/2003 | Shockey |
| 6,704,131 B2 | 3/2004 | Liu |
| 6,745,449 B2 | 6/2004 | Hanna et al. |
| 6,819,191 B2 * | 11/2004 | Funahara et al. ........ 331/68 |
| 6,827,449 B1 | 12/2004 | Klonis et al. |
| 6,833,942 B2 | 12/2004 | Liu |
| 6,833,944 B2 | 12/2004 | Liu |
| 6,879,147 B2 | 4/2005 | Lopes et al. |

(Continued)

OTHER PUBLICATIONS

IBM Technical Disclosure Bulletin, Dec. 1986, US, vol. 7, pp. 3085-3087.*

(Continued)

*Primary Examiner*—Thanh Van Pham
(74) *Attorney, Agent, or Firm*—Walter M. Douglas (57) ABSTRACT

The invention is directed to a hermetically sealed device and a method for making such device. The device includes optical, micro-electromechanical, electronic and opto-electronic devices, having a substrate with one or a plurality of optical, opto-electronic, electronic or micro-electromechanical ("MEMS") elements either singly or in combination that are located on a substrate; a covering having a top part and an extension extending a distance from the top part from the top part, an adhesive that is used to bond the extension portion of the covering to the substrate; and a sealing agent for hermetically sealing the area where the covering extension is bonded to the substrate. In the method of the invention the sealing agent is applied using atomic layer deposition techniques.

6 Claims, 9 Drawing Sheets

U.S. PATENT DOCUMENTS

| | | |
|---|---|---|
| 6,908,026 B2 | 6/2005 | Hanna et al. |
| 2004/0056365 A1* | 3/2004 | Kinsman .................... 257/778 |
| 2004/0189191 A1* | 9/2004 | Ohshita et al. ............. 313/504 |
| 2004/0207059 A1* | 10/2004 | Hong ......................... 257/678 |

OTHER PUBLICATIONS

"*Atomic layer deposition (ALD): from precursors to thin film structures*", Leskela, et al, Thin Solid Films 409 (2002) 138-146.

"*Electrical characterization of thin $Al_2O_3$ films grown by atomic layer deposition on silicon and various metal substrates*", Groner, et al, Thin Solid Films 413 (2002) 186-197.

"*Rapid Vapor Deposition of Highly Conformal Silica Nanolaminates*", Hausmann, et al Science, Oct. 11, 2002, vol. 298, 402-406.

"*Atomic layer deposited protective coatings for micro-mechanical systems*", Sensors and Actuators 103 (2003) 100-108.

\* cited by examiner

HERMETIC SEALS FOR MICRO-ELECTROMECHANICAL SYSTEM DEVICES

CROSS REFERENCE TO RELATED APPLICATION

This application claims the benefit of U.S. Provisional Application No. 60/696,314 filed Jun. 30, 2005 titled, "Hermetic Seals For Micro-Electromechanical System Devices", by Inventor Mike Xu Ouyang.

FIELD OF THE INVENTION

The invention relates to micro-electromechanical system devices, and in particular to the hermetic seals present in such devices and methods for making such seals.

BACKGROUND OF THE INVENTION

In micro-electromechanical system (MEMS) devices that have exposed electrodes, the hermetic sealing (bonding) of glass-to-glass ("G/G"), glass-to-silicon ("G/S") and silicon-to-silicon ("S/S") is very difficult to accomplish. Examples of applications that have such exposed electrodes include organic light-emitting diodes (OLED) and digital light processing (DLP™) packaging technologies, among others. In a very simple view of DLP devices, the devices comprise a housing, a mirror or an array of mirrors and/or other functional elements within the housing, and a glass window hermetically sealed to the housing. Hermetically sealing such packaging is quite difficult when there are temperature restraints; for example, the necessity of using temperatures of less than 250° C. and especially less than 150° C. to effect the seal. In such instances the use of lasers for localized heating to make the seal cannot be used when the electrodes are exposed because the localized heating can weaker or destroy electrode bonding. In cases where hermetic seal bonding temperature is not a problem, a dielectric material layer can be deposited over the electrodes and an indium-based solder is then used in conjunction with lasers to affect hermetic sealing. However, this method works only for low voltage and low frequency applications; cross-talk between electrodes being a major problem. Examples of the packaging of DLP devices can be found in a number of patent publications including U.S. Pat. Nos. 6,667,837; 6,745,449; 6,586,831; 6,624,921; 6,455,927; and 6,627,814.

In DLP packaging application the MEMS' mirror or mirror array, the heart of the DLP, must be hermetically packaged in a housing having a glass window to permit the entry and exit of light. Hermetic sealing is necessary to prevent contamination of the mirror, for example by dust particles, during operation of the equipment containing the DLP. In many existing processes Kovar® 7056 is used as the sealing material, bonding the glass window to the housing containing the DLP mirror or array of mirrors. While this material produces a good seal, the process used to affect bonding and sealing is both slow and labor intensive, resulting in high costs. As a result, it is highly desirable to find a different method and/or materials that can be used to hermetically seal devices such as OLED and DLP devices. The present invention discloses a novel method for effecting a hermetic seal in OLED, DLP and other devices requiring a hermetic seal. In addition to sealing DLP devices the process of the present invention can also be used in other devices such as DLP control devices that do not contain a glass window and in other optical, opto-electronic and electronic devices.

SUMMARY OF THE INVENTION

The invention is directed to a hermetically sealed device, including optical, micro-electromechanical, electronic and opto-electronic devices, having a substrate with one or a plurality of optical, opto-electronic, electronic or micro-electromechanical ("MEMS") elements either single or in combination and further including any electrodes or optical or electrical leads from said elements and/or devices on said substrates that can be used to establish electrical or optical contact with separate additional devices or elements; a covering having a plurality of continuous legs or extensions on one side thereon, the legs or extensions of the covering being bonded to the substrate by an adhesive or bonding material to form a chamber or a volume defined or substantially defined by the covering and the substrate that encloses the elements while permitting electrical or optical contact between the elements within the chamber and elements and/or devices external to the chamber; and a sealing agent in contact with the covering, the adhesive, and the substrate to hermetically seal the optical, opto-electronic, electronic or micro-electromechanical elements within the chamber defined by the covering, the adhesive and the substrate while allowing for passage of the electrical and/or optical leads from the elements within the chamber to devices and/or elements external to the chamber.

The invention is further directed to hermetically sealed digital light process ("DLP") devices having a electronic chip or micro-electromechanical elements in operational contact with an electronic chip on a substrate; a covering having a plurality of legs or extensions thereon, the legs or extensions being bonded to the substrate by an adhesive or bonding agent; and a sealing agent in contact with the covering, the adhesive, and the substrate to hermetically seal the electronic chip or micro-electromechanical elements in operational contact with an electronic chip within the chamber defined by the covering, the adhesive and the substrate while permitting electrical contact between the elements within the chamber and elements and/or devices external to the chamber.

The invention is further directed to a hermetically sealed digital light projection device having a micro-mirror within the device, the micromirror array being in operational contact with an electronic chip on a substrate; a covering having a planar transparent window for the passage of visible light therethrough and a plurality of legs or extensions on one side of the window extending a distance from the window, the legs or extensions being bonded to the substrate and/or to an electrode on the substrate by an adhesive or bonding agent to form a chamber; and a sealing agent in contact with the covering, the adhesive, and the substrate and/or electrode on the substrate to hermetically seal the micro-mirror array and its associated chip within the chamber defined by the covering, the adhesive and the substrate. Electrodes or electrical leads may extend from the chip through the coating, covering, adhesive and/or substrate from the array with the device to other devices and/or elements external to the chamber.

In another aspect the invention is directed to a method for making a DLP device having therein a hermetically sealed MEMS or a control chip, or other selected elements, the method have the steps of providing a substrate have one or a plurality of semiconductor chips, with or without addition elements operationally attached to the individual chips; providing a transparent or non-transparent covering (or cap structure) having a top portion and a plurality of extensions or "legs" extending continuously from one side of the top portion; bonding the covering to a substrate or to an electrode material on the substrate using an adhesive or bonding agent between the covering's legs and the substrate or electrode material thereon; dicing the substrate with bonded covering thereon along predetermined dicing lines so as to separate the individual MEMS or other devices from one another; coating selected areas of the MEMS or other device with a photoresist or other selected protective material; placing the individual MEMS or other devices in a vessel suitable for the deposition of a sealing agent; depositing the sealing agent on the MEMS or other devices; and removing the photoresist or other protective material to produce a MEMS or other device having a sealing agent thereon in the areas that were not protected by the photoresist or other protective material.

In yet another aspect the invention is directed to a hermetically sealed DLP device having a light transmissive glass window or a covering with a light transmissive glass window bonded to a substrate or an electrode deposited on a substrate by an adhesive or bonding agent, and a sealing agent deposited at the area where the adhesive or bonding agent bonds the glass window or cap to the substrate or electrode material on the substrate; the sealing agent covering the adhesive material and any filling any gaps between the glass window or cap and the substrate or electrode material on the substrate, including sealing the adhesive material.

DETAILED DESCRIPTION OF THE INVENTION

Figure 1A:
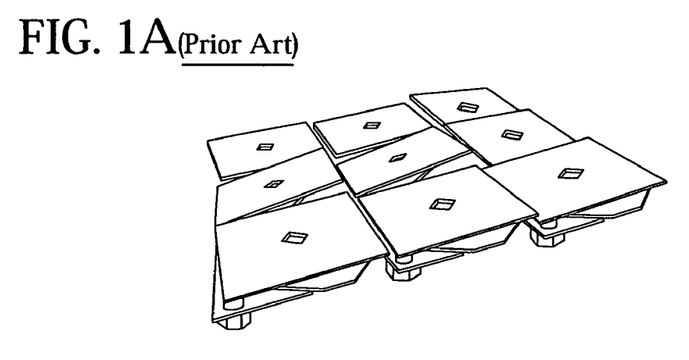
FIGS. 1A-1C illustrate a prior art array of micro-electromechanical mirrors (MEMS) (1A) that are can be contained in a single digital light processing (DLP) device (1B) having light-transmissive window, and a DLP control device (1C) having a non-transmissive cap as is known in the art.
Figure 1B:
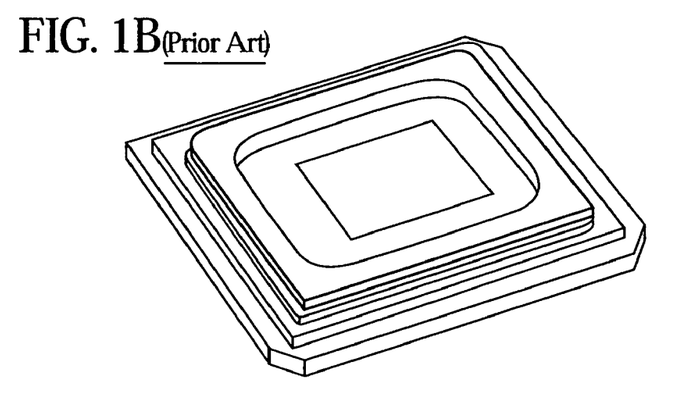
Figure 1C:
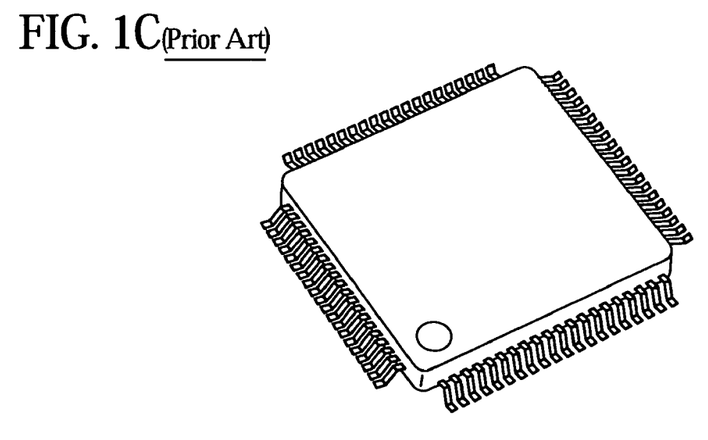
Figure 12:
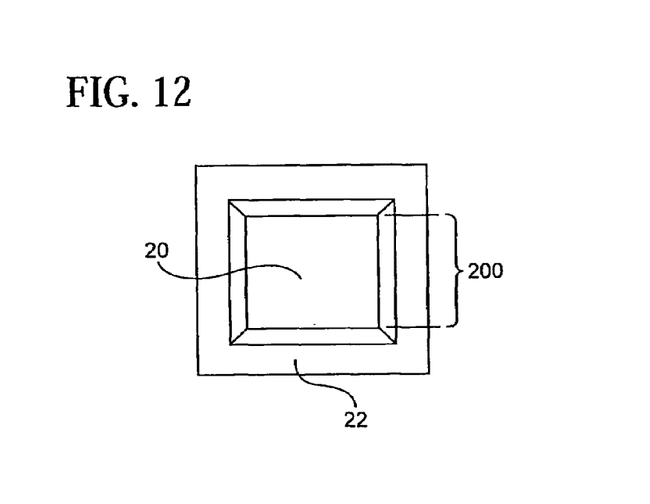
FIG. 12 illustrates from the underside a single covering having a top portion 20, continuous leg or extension 22 circumscribing the outer perimeter of the covering and extending a distance from the top to define a volume indicated by the single bracket 200.

As used herein, the term "covering" and "cap" as used herein means an element having a top portion with a first or top face and a second or bottom face and a continuous "leg" or extension having a thickness and a length that extends around the entire circumference or perimeter of the covering's top portion for a distance in one direction (see FIG. 12) from the bottom face such that when the covering is bonded by a bonding agent to any substrate and/or an element on a substrate the combination of the bottom face of the covering, the extension, the bonding agent and the substrate define an enclosed volume. The covering or cap may be made of any material suitable for the application in which the device will be used, such materials including silicon, opaque glasses, polymers, ceramics and glass-ceramics. Further, the covering or cap may have a top portion that is transparent, in full or in part, to electromagnetic radiation of selected wavelengths. For example, in FIG. 12 the top portion 20 may be transparent to visible light. The covering may also be opaque or non-transparent for use in control devices as illustrated in FIG. 1(C).

As used herein the term "device" includes optical, microelectromechanical, electronic and opto-electronic devices having a substrate with optical, opto-electronic, electronic or micro-electromechanical ("MEMS") elements, separately or in any combination, thereon.

Figure 2:
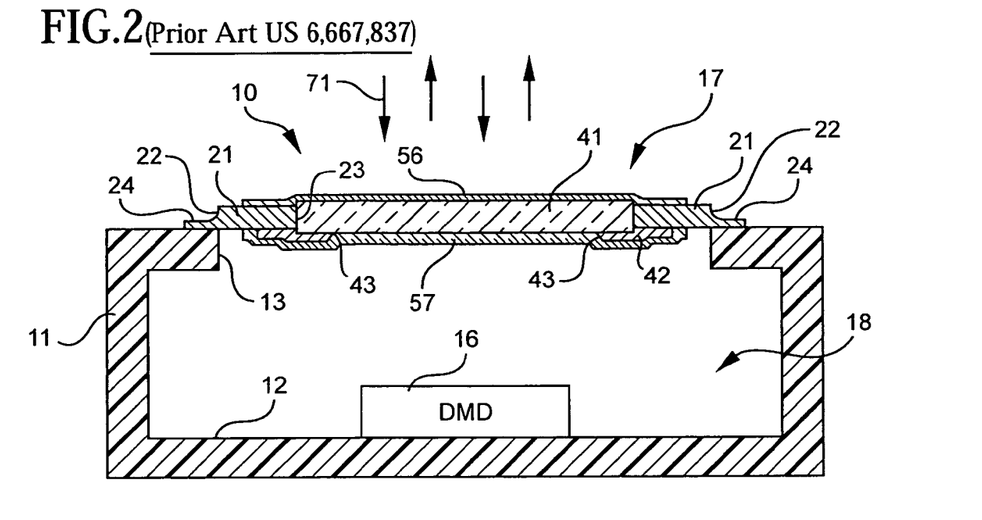
FIG. 2 is a prior art side view illustration of a digital micromirror device within a housing.

The invention is directed to methods of bonding and hermetically sealing glass-to-glass ("G/G"), glass-to-silicon ("G/S") and silicon-to-silicon ("S/S"), and glass or silicon to an electrode on a glass or silicon substrate. In particular the invention is directed to a two-step process for sealing G/G, G/S and S/S bonds that may be found, for example, in digital light processing ("DLP") devices as exemplified in FIGS. 1A-1C. FIG. 2 illustrates a typical DLP micromirror device of the prior art whose elements are described in the referenced patent.

Figure 3:
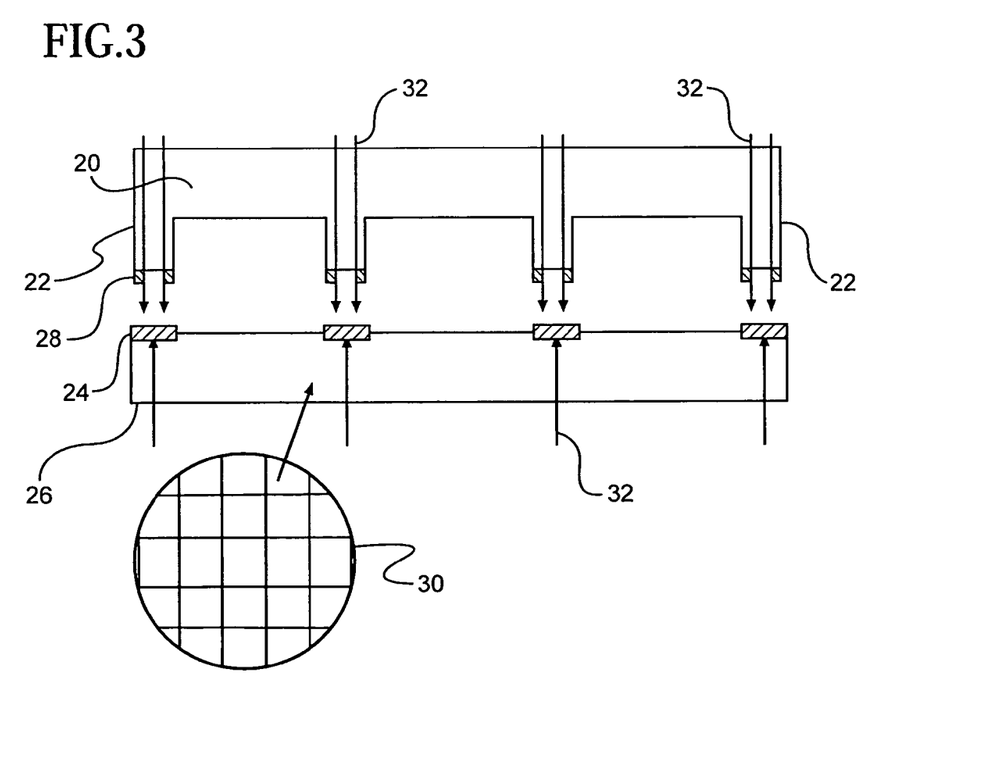
FIG. 3 illustrates the first step of a two step process for bonding and sealing a glass window or a non-glass cap to a wafer, or an electrode located on a wafer, the first step involving tempera bonding (epoxy) and dicing.
Figure 4A:
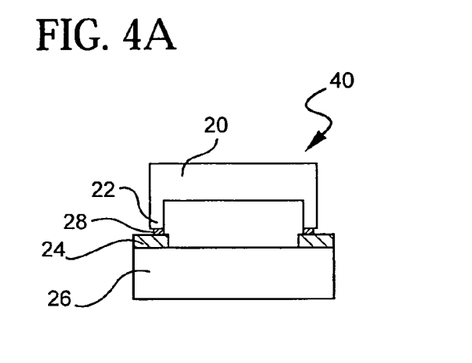
FIG. 4 illustrates the second step of the two step process in which after dicing and placing a photoresist on an individual device, the glass window or non-glass cap is hermetically sealed using atomic layer deposition (ALD) to deposit a sealing agent.
Figure 4B:
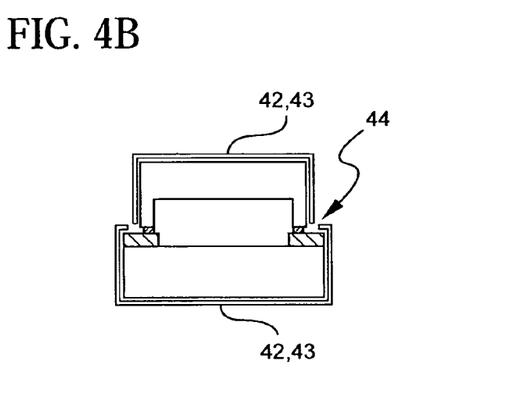

Referring now to FIG. 3, the first step of involves tempera bonding (epoxy) of glass to a silicon wafer and dicing. This is followed by a second step of hermetic sealing using atomic layer deposition as illustrated in FIG. 4. As illustrated in FIG. 3, a covering 20, for example, a glass window 20) which will be used herein to describe the invention) having plurality of extensions 22 is bonded to electrodes 24 located on a silicon wafer (substrate) 26 having a plurality of DLP elements formed thereon (see expanded view 30) by the use of an epoxy 28 coated on the tip of extensions 22. After the glass window 20 has been positioned on the electrodes and the epoxy cured, the wafer having the glass window positioned thereon is then diced along lines 32 to form the individual DLP chips. The glass window 20 can also have a pre-deposited shadow coating, for example, chromium, that has also been patterned thereon. The process, after dicing, results in the formation of individual DLP devices or chips 40 as illustrated in FIG. 4A.

Referring to FIG. 4, after formation of the individual DLPs (top, each is first coated with a photoresist material 42 from the outside edge of the glass leg 22 to the edge of the chip 40. The photoresist material 42 can be any photoresist material known in the art, for example, a high temperature polymer such as KAPTON™ tape or other high temperature material (see FIG. 4B). The photoresist is used to protect areas that do not need to be subsequently coated with an aluminum oxide ($Al_2O_3$) or other film; for example, the top and sides of the window and the silicon wafer material as indicted by numeral 43. Photoresist is not applied to the corner region 44 near leg 22 as indicated in FIG. 4B in order to leave the area containing the adhesive exposed. In preferred embodiments a portion of the extension 22 and the wafer in the area of the adhesive is also left exposed in order to ensure complete coverage of the adhesive by the ALD deposited material and good adhesion. After the photoresist has been applied, a film of selected material, for example, an $Al_2O_3$ film, is deposited at the corner area 44 near the leg 22 as indicated in FIG. 4C using atomic layer deposition ("ALD") techniques. During deposition of the $Al_2O_3$ the photoresist in areas 43 are also covered with $Al_2O_3$ as indicated by numeral 45 in FIG. 4C. After the application of the $Al_2O_3$ layer has been completed, the photoresist is stripped leaving only the corner region 44 near the epoxy coated with $Al_2O_3$. $Al_2O_3$ that coated the photoresist in areas 43 is removed along with the photoresist. The resulting product is as illustrated in FIG. 4D in which the extension 22 is bonded to the electrode 24 on top of silicon wafer material 26 by the epoxy 28 and the corner region 44 at extension 22 has been filled in by $Al_2O_3$ as indicated numeral 45.

Figure 4C:
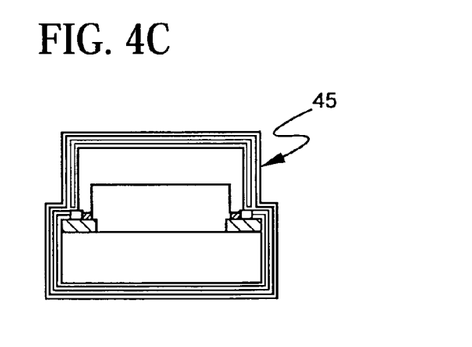
Figure 4D:
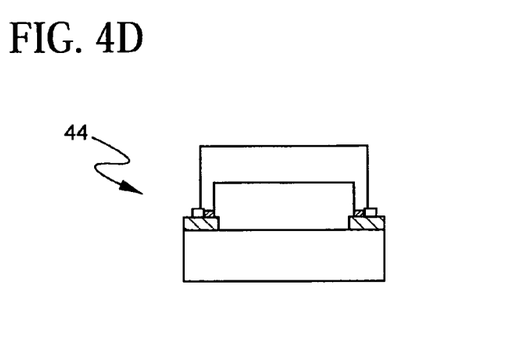
Figure 5:
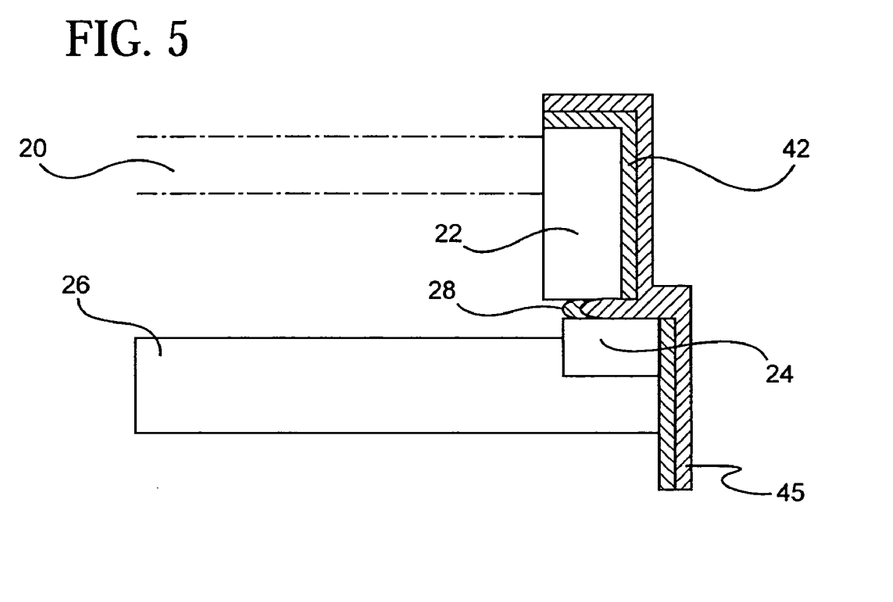
FIG. 5 is an expanded view of one corner of the device illustrated in FIG. 4(C) illustrating a covering bonded to a substrate by a bonding agent with photoresist and sealing agent applied.

FIG. 5 is an expanded partial view of FIG. 4(C) illustrating a corner of the device in which photoresist 42 (medium grey shading) and sealing agent 45 (dark grey shading) have been applied to the covering extension 22 that is bonded by bonding agent 28 (white half-oval) to an electrode 24 on substrate 26. The top part of the covering is represented by the dashed line and numeral 20.

Figure 6:
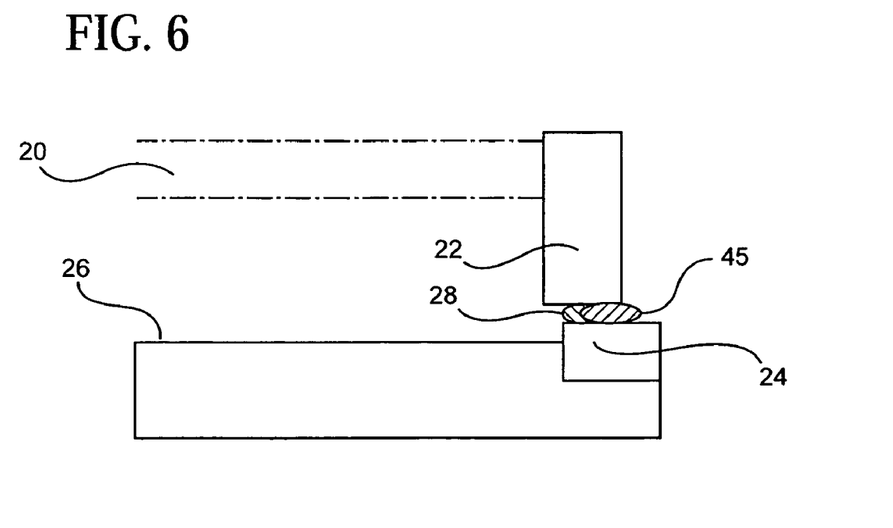
FIG. 6 is an expanded view of FIG. 4(D) illustrating a covering bonded to a substrate by a bonding agent with photoresist removed and sealing agent removed except at the location of the bonding agent.

FIG. 6 is an expanded view of FIG. 4(D) illustrating a corner of the device in which the sealing agent 45 conforms to and seals the corner at which the bonding agent 28 bonds extension 22 to electrode 24 on substrate 26.

ALD is a well-known mature process for the application of many different dielectric coatings. Typically the ALD process operates at pressures of 1-10 Torr. The advantage of using the ALD technique is that the film that is deposited conforms to the shape of the material to which it is applied and penetrates even into nanometer-size gaps with aspect ratio of 1:100 and over (see FIGS. 8 and 9). This unique feature makes ALD suitable for sealing any small gaps and holes that may be present in the object being processed. The ALD technique has been described in numerous scientific papers including those by M. Leskela et al., "Atomic layer deposition (ALD): from precursors to thin film structures," *Thin Solid Films* 409 (2002) 138-146; M. D. Groner et al., "Electrical characterization of thin $Al_2O_3$ films grown by atomic layer deposition on silicon and various metal substrates," *Thin Solid Films* 413 (2002) 186-197; and N. D. Hoivik et al., 'Atomic layer deposited protective coatings for micro-mechanical systems", *Sensors and Actuators* a103 (2003) 100-108.

Thin films known in the art that can be made using the ALD process include:

Group II-VI compounds: ZnS, ZnSe, ZnTe, $ZnS_{1-x}Se_x$, CaS, SrS, BaS, $SrS_{1-x}Se_x$, CdS, CdTe, MnTe, HgTe, $Hg_{1-x}Cd_xTe$, $Cd_{1-x}Mn_xTe$ Group II-VI based TFEL: ZnS:M (M D Mn, Tb, Tm), CaS:M (M D Eu, Ce, Tb, Pb), phosphors SrS:M (M D Ce, Tb, Pb, Mn, Cu)

Group III-V compounds: GaAs, AlAs, AlP, InP, GaP, InAs $Al_xGa_{1-x}As$, $Ga_xIn_{1-x}As$, $Ga_xIn_{1-x}P$ Nitrides:

Semiconductors/Dielectric: AlN, GaN, InN, SiN,

Metallic: TiN, TaN, $Ta_3N_5$, NbN, MoN

Oxides:

Dielectric: $SiO_2$, $Al_2O_3$, $TiO_2$, $ZrO_2$, $HfO_2$, $Ta_2O_5$, $Nb_2O_5$, $Y_2O_3$, $CeO_2$, $La_2O_3$, $SrTiO_3$, $BaTiO_3$ Transparent conductors: $In_2O_3$, $In_2O_3$:Sn, $In_2O_3$:F, $In_2O_3$:Zr, $SnO_2$, $SnO_2$:Sb, ZnO, Semiconductors: ZnO:Al, $Ga_2O_3$, NiO, $CoO_x$ Superconductors: $YBa_2Cu_3O_{7-x}$ Other ternary oxides: $LaCoO_3$, $LaNiO_3$ Fluorides: $CaF_2$, $SrF_2$, $ZnF_2$ Elements: Si, Ge, Cu, Mo Metals: Cu, W, Ti, Ta, Ni, Pt Others: $La_2S_3$, PbS, $In_2S_3$, $CuGaS_2$, SiC While any of the materials shown in the foregoing list can be used in the ALD process to provide hermetically sealed optical, electronic, micro-electromechanical, and opto-electronic systems and/or devices in accordance with the invention, low temperature materials, that is, materials that can be formed and/or deposited at temperatures below 250° C., are of preferred for DLP applications including micromirror and control devices. Aluminum oxide ($Al_2O_3$) is particularly preferred for the applications described herein.

In the ALD deposition of $Al_2O_3$ the most common precursor materials are TMA (trimethylaluminum) and water ($H_2O$). The by-product of the reaction of these materials is methyl alcohol which is removed from the system. $Al_2O_3$ is a preferred material because it has a very wide process temperature window that ranges from 100° C. to 400° C. As a result of this temperature range, high polymeric photoresists can be used as the mask material to protect the regions to be coated. Polymeric materials that can be used as photoresists include polyimides (for example, Kapton® (DuPont), polysulfones, polyaromatics and fluorocarbons. After $Al_2O_3$ deposition the photoresist is stripped from the $Al_2O_3$ coated article as has been stated above, taking with it the $Al_2O_3$ from all areas except that near extension 22 which is sealed by the deposited $Al_2O_3$ film.

Figure 7A:
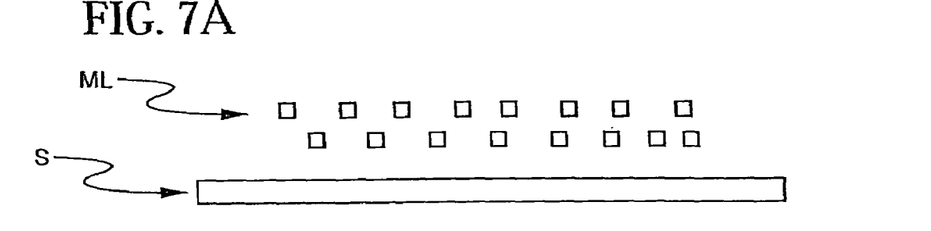
FIGS. 7A-7D illustrate the growth mechanism for a binary compound laid down by ALD where the substrate is S, the precursors are ML and AN, the film on the substrate is MN, and the volatile material is LA.
Figure 7B:
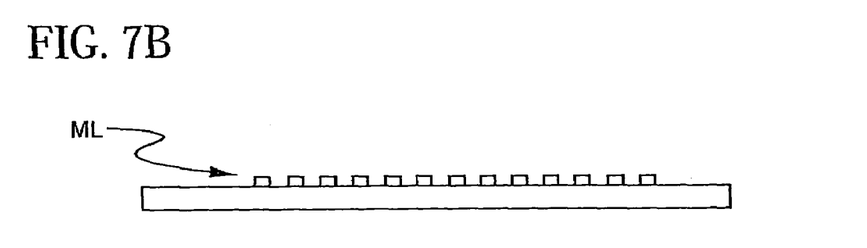
Figure 7C:
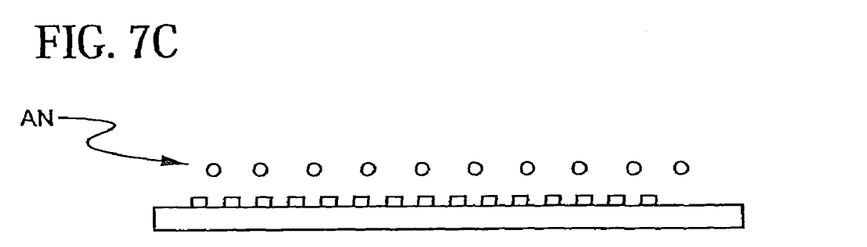
Figure 7D:
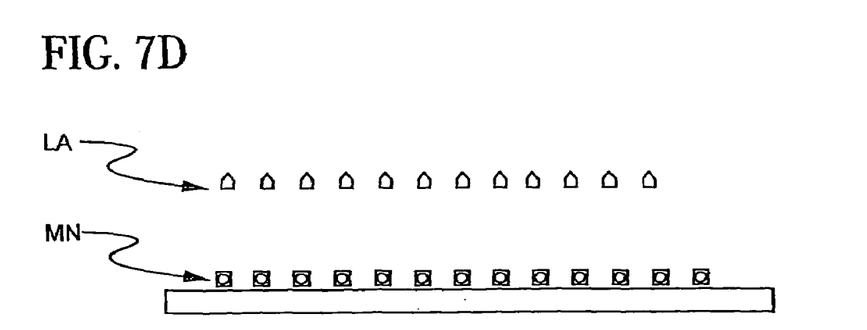

FIG. 7A-7D illustrates in a general way how ALD is carried out. A substrate S is exposed to a first molecular precursor material ML as indicated in FIG. 7A. This first precursor forms a saturated layer on substrate S as indicated in FIG. 7B. The absorbed layer is then exposed to a second precursor material AN as indicated in FIG. 7C. During this exposure an exchange reaction takes place between ML and AN to form, as indicated in FIG. 7D, the thin film MN on substrate S and a by-product LA which is removed by being pumped away by application of vacuum. These foregoing steps can be repeated through a number of cycles to grow films of the desired thickness.

Figure 8:
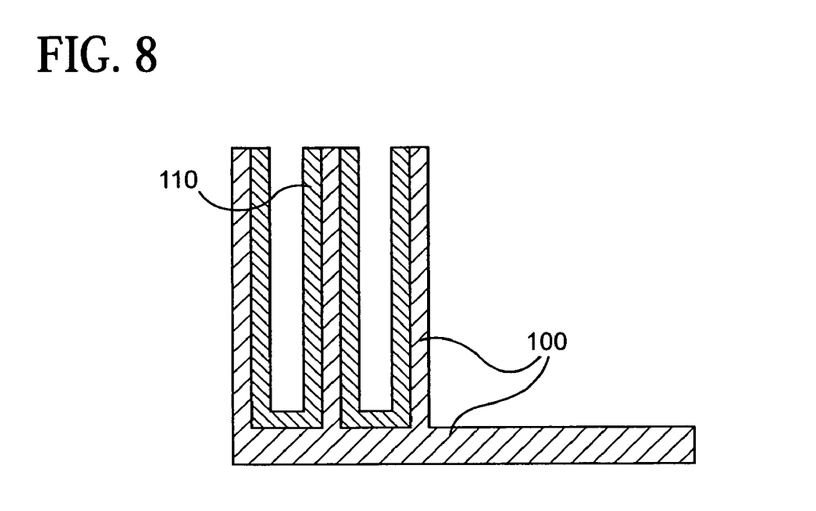
FIG. 8 is an illustration showing how a coating 110 conforms to the shape of a substrate 100 when the coating is applied using the ALD technique.
Figure 9:
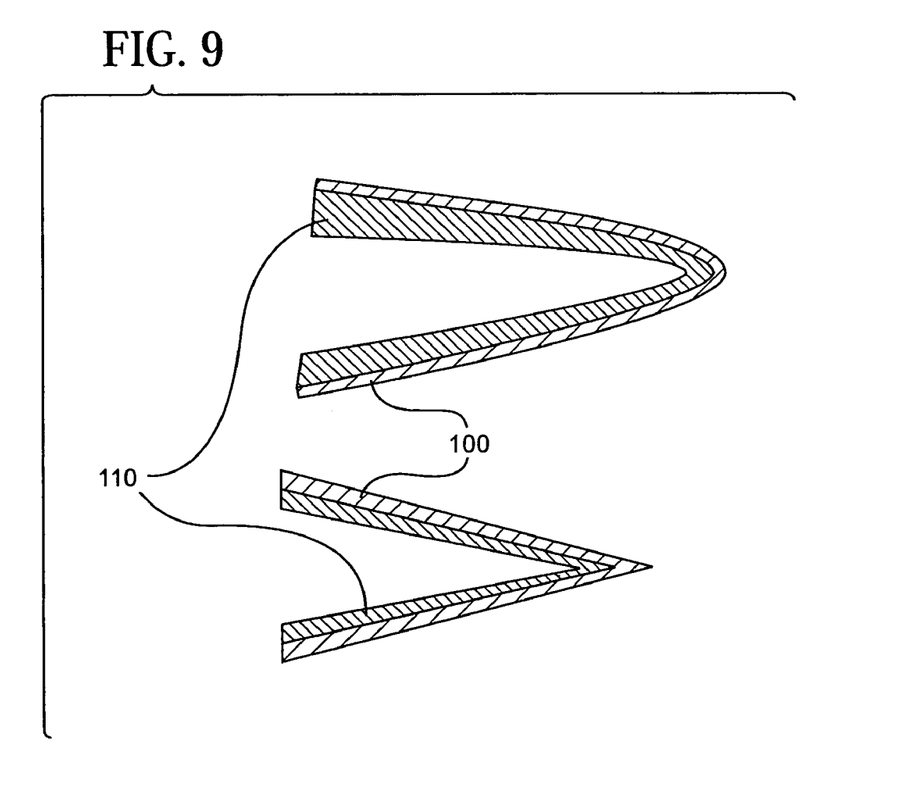
FIG. 9 is a further illustration of a conformal coating 110 applied to substrates 100 having different shapes conforms to the shape of the substrates.

FIGS. 8 and 9 are simple illustrations of how a coating 110 conforms to the shape of a substrate 100 when the coating is applied using the ALD technique. Hausmann et al., "*Rapid Vapor Deposition of Highly Confroming Silica Nanolaminates*", SCIENCE, 11 Oct. 2002, Volume 298, pages 402-406, describe how highly uniform and conformal coating can be made using ALD. In their article a nanotrench approximately 7 μm deep and 0.1-0.2 μm in diameter was filled using the ALD technique. The trench had a taper with the open top being slightly wider than the bottom. On page 404 of the article the authors provide a figure (FIG. 3) illustrating a nano-trench before, during and after coating with $SiO_2$ (formed by the reaction of tetramethylsilane and water). It particularly to be noted that the bottom of the trench was conformally coated with a uniform silica ($SiO_2$) film that is 46 nm thick. The ability of the ALD technique to conformally coat enables it to be used in the current invention to hermetically seal DLP windows, control devices and other electronic, optical and opto-electronic devices.

Figure 10:
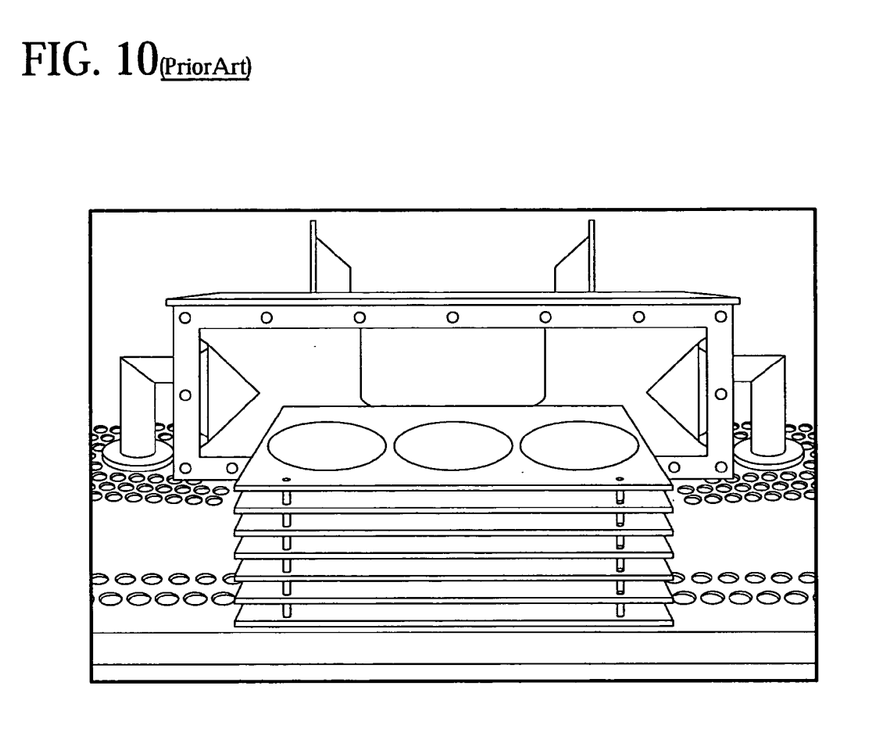
FIG. 10 illustrates a constant flow ALD reactor.
Figure 11:
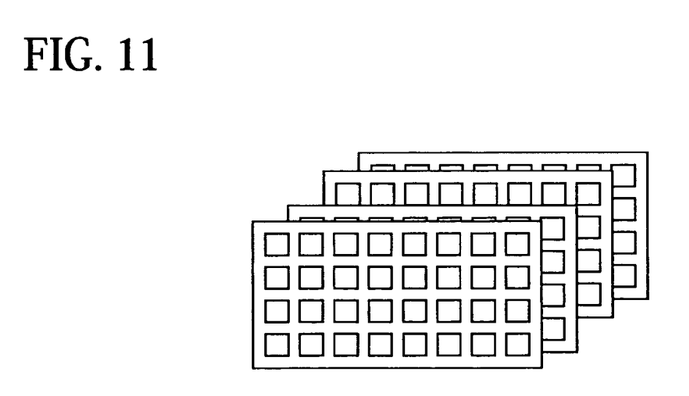
FIG. 11 illustrates a wafer holder for holding a plurality of DLP devices in the reactor of FIG. 10.

FIG. 10 illustrates a constant flow ALD reactor (Plasma Systems) with wafer holder and wafers on the holders. FIG. 11 illustrates a DLP wafer holder that can be used in the hermetic edge sealing method described herein. The thin film will be uniformly deposited on wafers mounted on both sides of the wafer holder illustrated in FIG. 8. After coating and sealing the chips, they are removed from the reactor and holder and the applied photoresist are removed leaving a seal between the extension 22 and the substrate or surface to which the extension is joined by the adhesive.

There are many advantages to using the ALD process for hermetic sealing, particularly for sealing OLED and DLP elements. Examples of the advantages to using ALD technology include:

Deposition of $Al_2O_3$ films at temperatures of <150° C.

The ALD coated films are conformal; the coating filling any gaps and holes between the legs of the glass window and the electrode and/or an underlying substrate.

The ALD process can be used to deposing coating materials such as $Al_2O_3$ on plastic substrates.

Regions where a coating is not wanted can be protected by a photoresist or other materials such as Kapton tape.

The thickness of the deposited film can be very precisely controlled by simply adjusting the number and duration of the deposition cycles since the growth rate is self-limiting for each cycle.

A plurality of DLP chips can be loaded into the ALD coater, particularly using the wafer holders illustrated in FIG. 8.

ALD coated layers have good adhesion on gold which is generally used for the chip electrodes.

The ALD process can also be used to deposit anti-reflective coatings on one or both sides of the glass windows in a separate process step.

The ALD process is done according to a predetermined "recipe" or procedure and is highly repeatable; the process being independent of the operator.

Accordingly, the invention is directed to a hermetically sealed optical, electronic, micro-electromechanical, and opto-electronic systems and/or devices having a substrate, a covering having legs, a bonding materials for bonding the covering legs to the substrate and a sealing coating applied to the area where the bonding material joins the covering legs to the substrate to thereby hermetically seal the covering to the substrate. Example, without limitation, of the devices that can be made using the invention include digital micromirror devices containing a plurality of digital light processing ("DLP") mirrors; control devices (for example, DLP control devices as illustrates in FIG. 1C; photonic devices for process and/or transmitting optical telecommunications signals; and similar other devices known in the optical, opto-electronic and electronic fields that have a covering over a substrate or a base.

Substrates suitable for use according to the invention include glasses and highly purity fused silica, including glasses and high purity fused silicas (both with and without selected dopants), silicon substrates, glass ceramics of any composition and polymeric substrates known to be or found to be suitable for making optical, electronic, micro-electromechanical, and opto-electronic systems and/or devices.

In addition, the substrates may have electrodes thereon; the covering according to the invention can be bonded to the electrode by use of the adhesive or bonding agent—for example, as illustrated in FIGS. 3 and 4; and the sealing coating applied to the electrode surface in addition to its being applied to the area where the bonding material joins the covering legs to the electrode materials. The electrode material(s) can be any material known in the art; for example, gold, copper, silver, nickel, gold over nickel or copper, and similar materials or combination of materials known in the art.

Figure 13:
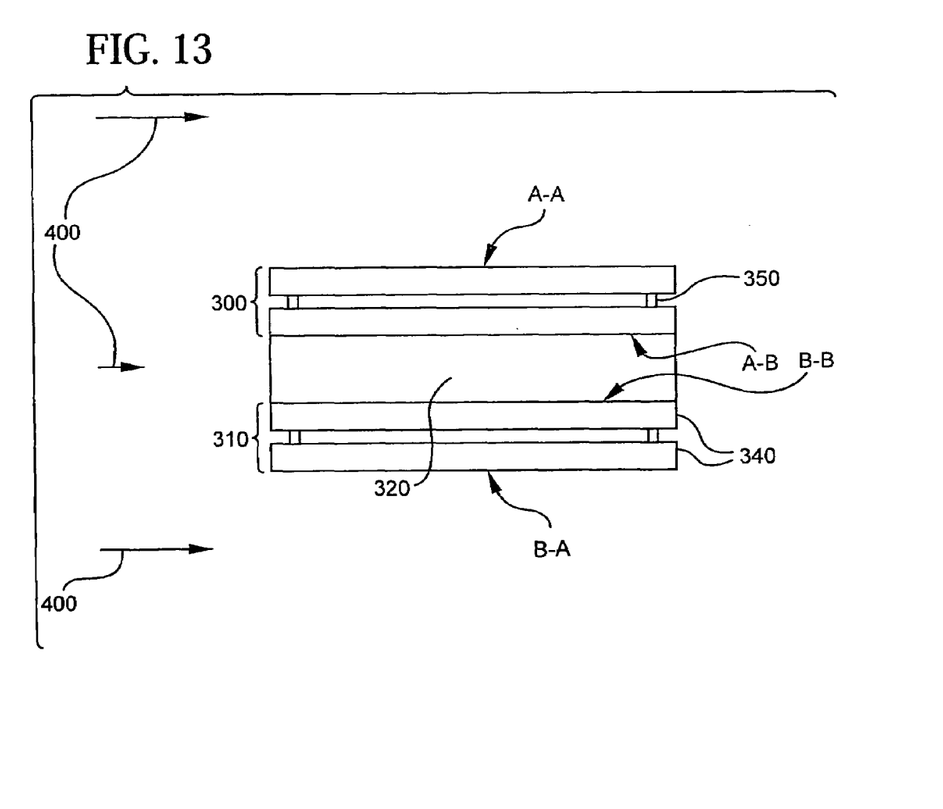
FIG. 13 illustrates two Devices 300 and 310 with surfaces A-A and B-A that will be coated using ALD, wherein Device 300 surface A-B and Device 310 surface B-B are protected by layer 320 and are not coated during an ALD deposition step.

FIG. 13 illustrates a method for simultaneousle coating selected surfaces of two or a plurality separate devices with a sealing agent or other material as described below. For illustration purposes two devices are shown in FIG. 13; Device A (numeral 300) with surfaces A-A and A-B, and Device B (numeral 310) with surfaces B-A and B-B, in which is it preferred that one face, or other area, of each device not be ALD coated. As illustrated in FIG. 13, the two devices can be place together with a protective layer 320 interposed between the two devices such that Device A surface A-B and Device B surface B-B are not coated during an ALD deposition coating step. Examples, without limitation, of materials that can be used to protect the surfaces from coating includes paper placed between the two surfaces; polymeric materials: for example, polyethylene terephthalate (PET), polymeric fluorocarbons and chlorofluorocarbons such as TEFLON™, polyimides such as Kapton®, polypropylene oxide (PPO); and other suitable materials that may be known in the art. The only requirements for the coating materials are that they be thermally stable at the temperatures at which ALD is carried out and that they contaminate or permanently adhere to the protected surfaces. Once coating is finished the protective materials is removed. Referring to FIG. 13, the surfaces that are coated are 310 and 320, the edges as exemplified by 340, and the space between the layers as resulting from the presence of a spacer or other element 350 that separates the material or substrate having surface A-A from the material or substrate having surface A-B. Collectively, 340 and 350 may be referred to as "edges." In a further embodiment of the invention, if only the side or edges 340 and 350 are desired to be coated, then a protective layer can also be applied to surfaces A-A and B-A illustrated in FIG. 13. In yet another embodiment, additional devices can also be stacked-up with a protective layer between each device so that one has a plurality of devices (for example, 3, 4, etc) that can be coated simultaneously. To summarize, the method described above can be used to coat selected surfaces of a plurality of devices, the method having steps in addition to those described herein of:

placing a protective layer in contact with at least one selected surface of a first device and one selected surface of a second device;

depositing a sealing/coating material on the surfaces of the device that are not in contact with said protective layer; and separating said devices and removing said protective layer to provide a device having coated selected surfaces.

Stacking a plurality of devices with a protective layer between them and a protective layer on the top-most and bottom-most surfaces, for example A-A and B-A in FIG. 13, is particularly useful when it is desired to coat only the sides and edges of a device. This helps to facilitate production and reduce costs. Multiple coating layers or the same or of different materials can be applied in all embodiments. Broad arrows 400 illustrate the ALD precursor flow direction.

Figure 14A:
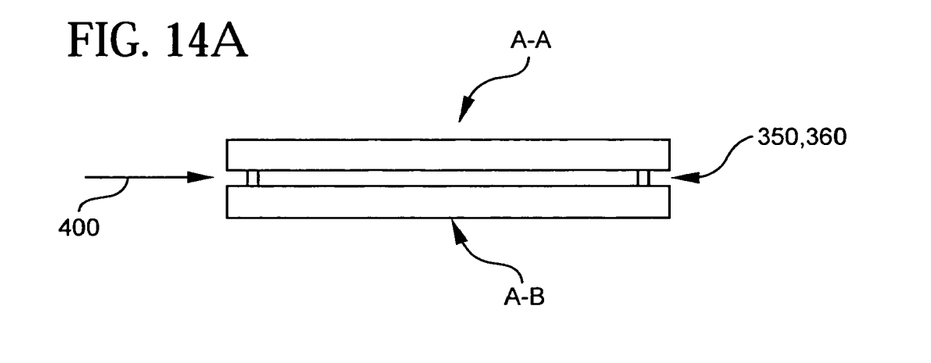
FIG. 14A illustrates an embodiment in which ALD layers will be coated on all surfaces and edges.
Figure 14B:
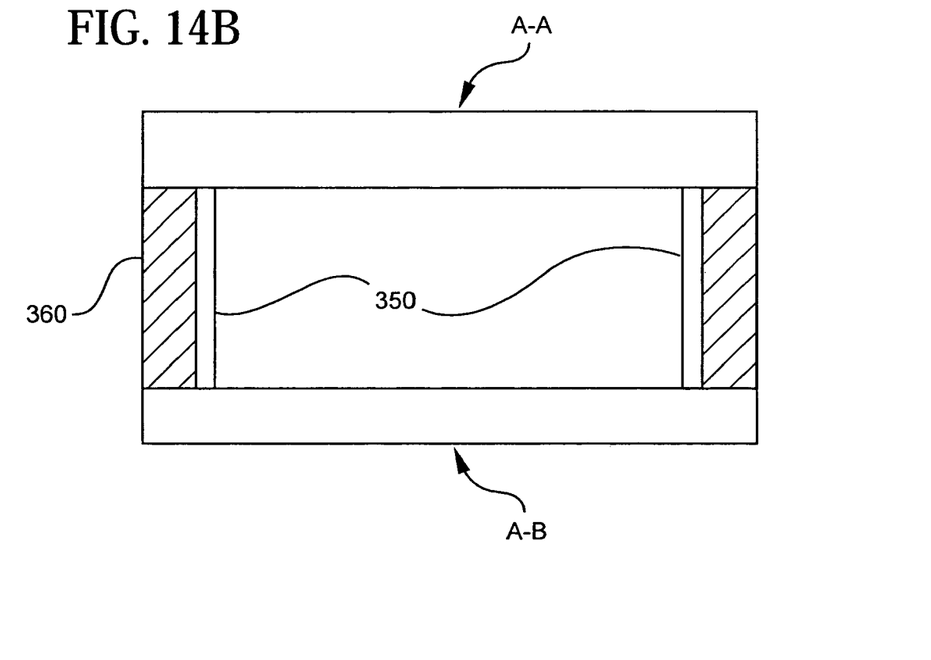
FIG. 14B is an expanded view of FIG. 14A further illustrating coatings in selected areas.

FIG. 14A represents only Device A having surfaces A-A and A-B and the spacer or other element 350 that separates the material or substrate having surface A-A from the material or substrate having surface A-B. In this case, the ALD deposited layers will coat all surfaces and edges (the hermetic sealing region) including surfaces A-A and A-B, the edges and the space between the material or substrate having surface A-A from the material or substrate having surface A-B that that results from the presence of spacer or element 350. ALD flow is in direction 400. The coating in the area represented by spacer or element 350 fills this region, partially or completely, to hermetically seal the device (see FIG. 14B, hatched area 360). The coating can be a single layer of a materials or multiple layers of one or a plurality of substances with selected optical features; for example, without limitation, anti-reflection coatings or materials, coatings or materials to impart UV and/or IR filters properties, coatings or materials to impart dichroic filter properties, coatings or materials to impart color filter properties (make a color filter) and coatings or materials suitable for making laser mirrors [that is, to make devices having UV and IR filters, color filters, dichroic filters, laser mirrors, devices with only anti-reflective coatings and any combination of the foregoing or similar elements/devices known in the art]. These types of coatings are also beneficial for devices that use organic materials (for example, polymers) as substrates. Organic light-emitting diodes (OLEDs) are an example. When the substrate is a glass, the coating will hermetically seal at all edges as well as providing designed optical functions to the glass surface(s). As mentioned in the preceding paragraph, a plurality of devices can be stacked one on top of an other FIG. 14B is an expanded view of FIG. 14A illustrating how a sealing agent or other material 360 would coat the area around spacer 350 that lies between the material having surface A-A and the material having surface A-B. If the device of FIG. 14A were coated by itself, without any protection layer on A-A or A-B, or elsewhere, then all surfaces in addition to that illustrated by 350, 360 in FIG. 14A would also be coated. If Devices as illustrated in FIG. 13 were coated, then surfaces A-A and B-A would be coated in addition to area 350 and other edges unless such were protected during deposition by a protective layer as described herein.

The substrate according to the invention can have one or a plurality of areas each of which contains a complete optical, electronic, micro-electromechanical and/or opto-electronic system and/or device, each of which is to be separately covered and subsequently separated from one another by dicing as described herein. In cases where the substrate contains a plurality of such devices, covering has a sufficient plurality of legs such that each device within on the substrate will be encased with a separate covering after the dicing is completed. Subsequent to the dicing the separated devices processed and the contents therein are hermetically sealed.

In some embodiments the method includes providing a sealing agent comprises providing a sealing agent selected from the group consisting of $SiO_2$, $Al_2O_3$, $TiO_2$, $ZrO_2$, $HfO_2$, $Ta_2O_5$, $Nb_2O_5$, $Y_2O_3$, $MgO$, $CeO_2$, $La_2O_3$, $SrTiO_3$, $BaTiO_3$ and fluorine doped silica, and flourine doped silica, including compound/laminar layers and multilayers of the foregoing materials either alone or in any combination. The layers and multilayers can be a part of the components such as the AR (anti-reflection coating), an optical filter layer/multilayer, and similar components. In cases when an AR or optical filter layer or multilayer is used to seal the edge(s), optionally a mask is not required for application of the sealing agent.

The invention is further directed to a process for making hermetically sealed optical, micro-electromechanical, electronic and opto-electronic systems and/or devices; the process having at least the steps of:

providing a substrate;

providing a covering having a top portion with a first or top face and a second or bottom face and a continuous "leg" or extension having a thickness and a length that extends around the entire circumference or perimeter of the covering's top portion for a distance in one direction (see FIG. 12) from the bottom face;

providing an adhesive or bonding material for bonding the covering extension to the substrate;

bonding the covering extension to the substrate;

applying a photoresist, or other protective or covering material, to areas of the device of step (4) to thereby prevent such areas from being coated with a sealing material, in particular the area where the covering extension is bonded to the substrate;

coating the device with a selected coating material to thereby effect a hermetic seal between the covering and the substrate; and removing the photoresist, or other protective material, to provide an optical, electronic and/or opto-electronic device having a hermetic seal between the covering and the substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

I claim:

1. A method for making a hermetically sealed device, said method comprising the steps of:

providing a substrate having thereon, separately or in any combination, optical, opto-electronic, electronic or micro-electromechanical ("MEMS") elements, and including any electrodes or electrical leads, extending from said elements and/or on said substrate that can be used to establish electrical contact between said elements and separate additional devices or elements;

providing a covering having a top portion with a first or top face and a second or bottom face and an extension having a thickness and a length that extends around the entire circumference or perimeter of the covering's top portion for a distance in one direction from the bottom face;

providing an adhesive for bonding said covering to said substrate, including to any electrodes or electrical leads that extend from said elements on said substrate to separate elements or devices outside the chamber defined by the covering when bonded to substrate;

bonding said covering to said substrate using said adhesive; and providing a sealing agent and applying said sealing agent to the area where said adhesive bonds said covering extension to said substrate to hermetically seal the optical, opto-electronic, electronic or micro-electromechanical elements within the chamber while allowing for passage of the electrodes and/or electrical leads from the elements within the chamber to separate additional devices or elements outside the chamber and wherein said method further comprises coating selected surfaces of a plurality of devices, said method comprising:

placing a protective layer in contact with at least one selected surface of a first device and one selected surface of a second device;

depositing a sealing/coating material on the surfaces of the device that are not in contact with said protective layer; and separating said devices and removing said protective layer to provide a device having coated selected surfaces.

2. The method according to claim 1, wherein the sealing agent is applied using atomic layer deposition techniques.

3. The method according to claim 1, wherein the sealing agent is applied using atomic layer deposition techniques and a first and a second sealing agent component that react upon deposition to form the sealing agent and a volatile material that is removed.

4. The method according to claim 1, wherein providing a sealing agent comprises providing a sealing agent selected from the group consisting of single or a plurality layers of $SiO_2$, $Al_2O_3$, $TiO_2$, $ZrO_2$, $HfO_2$, $Ta_2O_5$, $Nb_2O_5$, $Y_2O_3$, $MgO$, $CeO_2$, $La_2O_3$, $SrTiO_3$, $BaTiO_3$ and fluorine doped silica, including compound/laminar layers and multilayers of the foregoing materials either alone or in any combination.

5. The method according to claim 1, wherein the sealing agent is selected from the groups consisting of anti-reflection coatings, coatings or materials to impart UV and/or IR filters properties, coatings or materials to impart dichroic filter properties, coatings or materials to impart color filter properties, and coatings or materials suitable for making laser mirrors.

6. The method according to claim 1, wherein the device is an organic light-emitting diode device.

* * * * *